United States Patent

Baldwin et al.

[11] Patent Number: 5,892,283
[45] Date of Patent: Apr. 6, 1999

[54] CONNECTION OF ACTIVE CIRCUITRY VIA WIRE BONDING PROCEDURE

[75] Inventors: David John Baldwin, Allen; Ross E. Teggatz, McKinney, both of Tex.

[73] Assignee: Texas Instruments Incorporated, Dallas, Tex.

[21] Appl. No.: 991,118

[22] Filed: Dec. 16, 1997

Related U.S. Application Data

[60] Provisional application No. 60/033,526, Dec. 18, 1996.

[51] Int. Cl.$^6$ .......................... H01L 23/48; H01L 23/52; H01L 29/40
[52] U.S. Cl. .......................... 257/758; 257/774; 257/784; 257/786
[58] Field of Search .................................. 257/735, 736, 257/737, 753, 758, 759, 760, 774, 784, 786

[56] References Cited

U.S. PATENT DOCUMENTS

| | | | |
|---|---|---|---|
| 5,010,389 | 4/1991 | Gahsauge et al. . | |
| 5,381,105 | 1/1995 | Phipps | 324/765 |
| 5,451,810 | 9/1995 | Tigelaar et al. | 257/530 |
| 5,742,094 | 4/1998 | Ting | 257/620 |

FOREIGN PATENT DOCUMENTS

| | | |
|---|---|---|
| 0 166 112 A | 1/1986 | European Pat. Off. . |
| 1- 217976 A | 8/1989 | Japan . |
| 2 004 417 | 9/1977 | United Kingdom . |

*Primary Examiner*—Ngan V. Ngo
*Attorney, Agent, or Firm*—W. James Brady, III; Richard L. Donaldson

[57] ABSTRACT

A method of fabricating a bond and the bond. The process includes providing a lower level (M1,13, 15) of electrically conductive metal disposed on a substrate having a pair of spaced apart sections. An electrically insulating layer (11) is then disposed over the lower level and vias (23) are formed in the electrically insulating layer, individual ones of the vias extending to one of the spaced apart section of the lower level. An upper level of electrically conductive metal (M2, 17, 19) is disposed on the electrically insulating layer, the upper level having a pair of spaced apart sections, each coupled to one of the sections of the lower level through a via. One of the pair of spaced apart sections of the lower level is preferably essentially U-shaped (13) and the other section (15) of the lower level is essentially rectangular shaped and extends into the open end of the "U". One of the pair of spaced apart section of the upper level is essentially rectangular (17) with a rectangular aperture at its central region and the other section of the upper level (19) is essentially rectangular and disposed within the rectangular aperture. A bond (23) is formed completely enclosing the spaced apart sections of the upper level.

18 Claims, 1 Drawing Sheet

CONNECTION OF ACTIVE CIRCUITRY VIA WIRE BONDING PROCEDURE

This application claims priority under 35 USC § 119(e)(1) of provisional application Ser. No. 60/033,526 filed Dec. 18, 1996.

BACKGROUND OF THE INVENTION

1. Field of the Invention

This invention relates to a method and structure which permits measurement to be taken of individual circuits and/or circuit components of an integrated circuit which could otherwise not be individually measured when connected within the integrated circuit.

2. Brief Description of the Prior Art

It is often desirable to test individual circuit portions and/or individual components of an integrated circuit prior to completion of fabrication. Such testing can avoid completion of fabrication of devices which already have a defect, thereby providing an economic saving and removing potentially inferior or non-working devices from the line. This type of testing has importance and several solutions have been provided by the prior art.

For example, in one prior art procedure as shown in FIG. 1, in order to improve the safe operating area (SOA) of a power transistor, a clamp in the form of a diode stack having a standard diode and a zener diode in back to back relation is placed across the gate and drain of the transistor. The diode stack will break down prior to the breakdown of the power transistor. This places the transistor in a forward biased SOA which is much stronger than placing the transistor in a reverse biased SOA (RBSOA). A problem with this arrangement is that, if the breakdown voltage of the stack is close to or above that of the transistor, the transistor may go into an RBSOA mode and will break down first with the stack having essentially no effect. It is therefore apparent that, in order for such an arrangement to be successful, it is imperative that the breakdown voltage of the transistor be much greater than the breakdown voltage of the diode stack. However, there is no good way to determine that this relation exists, so it cannot be accurately determined upon testing whether a breakdown is being caused by the diode stack or the power transistor. Disadvantage of this type of arrangement are that (1) the $BV_{dss}$ of the transistor cannot be tested, (2) the $BV_{dss}$ of the transistor cannot be distinguished from the BV of the diode stack, (3) leakage in the transistor cannot be distinguished from leakage in the diode stack and (4) the unclamped energy capability of the transistor cannot be tested because the BV of the diode stack is less than $BV_{dss}$.

In a second prior art arrangement as shown in FIG. 2, the diode stack and the transistor are separated from each other at the output by providing a split bond pad having two separated sections, one section attached to the diode stack and the other section attached to the transistor. In this way, testing of the stack can take place separately at probe with the split bond pad later being connected together during bonding by having the bond extend across both bond pad sections. Problems that arise with this procedure are that the bond pad must be large, thereby decreasing the number of components that can be placed in a given area, there is an inefficient use of high current bonding since only half of the bond area is used for high current switching, there is the possibility of contaminant ingress due to the nitride opening at the bond pad metal edge of the field oxide and there is the possibility that an undesirable hump may be formed during the bonding procedure rather than a conformal bond to the pads.

SUMMARY OF THE INVENTION

In accordance with the present invention, the above described problems of the prior art are minimized if not eliminated by leaving discrete portions of the circuit disconnected for the purpose of testing and properly connected after probe test by normal implementation of wire bonding in the assembly process. Individual circuit elements can be tested individually without interfering with each other.

The above is accommodated by use of a normally-sized bond pad with the entire periphery of the bondwire-to-metallization bonding area available to supply a high current path with the bond sealing the opening between the metal conductors to prevent ingress of contaminants into the opening. The bond pad includes plural, preferably two, regions, preferably levels, of electrically conductive metal, preferably TiW/Al, Al, Al—Cu or any metal with a compatible bonding process (usually the metals are the same), one alongside or atop the other and spaced from each other with a standard electrical insulator, generally silicon dioxide or silicon nitride. The second region or bottom level includes two section which are spaced from each other (e.g. a U-shaped section with a rectangular section disposed within the "U" and spaced from the "U"). The first region or top level also includes two sections, one section (e.g. a first rectangular section [it could also be circular or polygonal or any other two dimensional shape] with a hollow rectangular interior) coupled to one of the bottom section (e.g. the U-shaped section) through a via in the insulator and the other section (e.g. a second rectangular section within the hollow rectangular interior and spaced from the first rectangular section) coupled to the other bottom section (e.g. the rectangular section) through a via in the electrical insulator. One of the sections of the first region or top level is preferably located in the center of the bond pad area to insure that the bond later made is positioned in and over the space between the two top level sections.

In operation, one of the bottom sections is coupled to the zener stack and the other bottom section is coupled to the power transistor. Probe testing is accomplished by contacting the top section coupled through a via to the appropriate bottom section with a probe in standard manner. When bonding to the bond pad later takes place, the bond will enter the space between the two upper level sections and cover the centrally located space between the two top sections. In this way, the bond area is available, the space between top sections will be likely to be covered by a bond during bonding due to its central location and the bond pad area is not changed to accommodate testing. Also, no contaminants can enter the bond region as in the prior art discussed above.

DESCRIPTION OF THE PREFERRED EMBODIMENT

Figure 1:
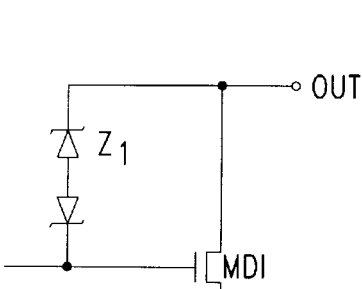
FIG. 1 is a first prior art circuit for making test measurements on circuitry.
Figure 2:
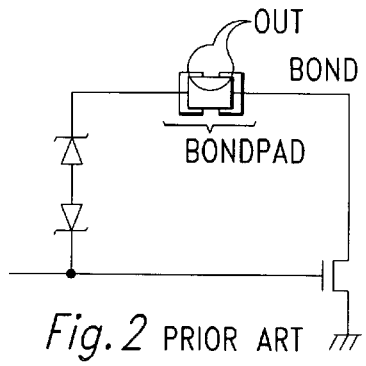
FIG. 2 is a second prior art circuit for making test measurements on circuitry.
Figure 3:
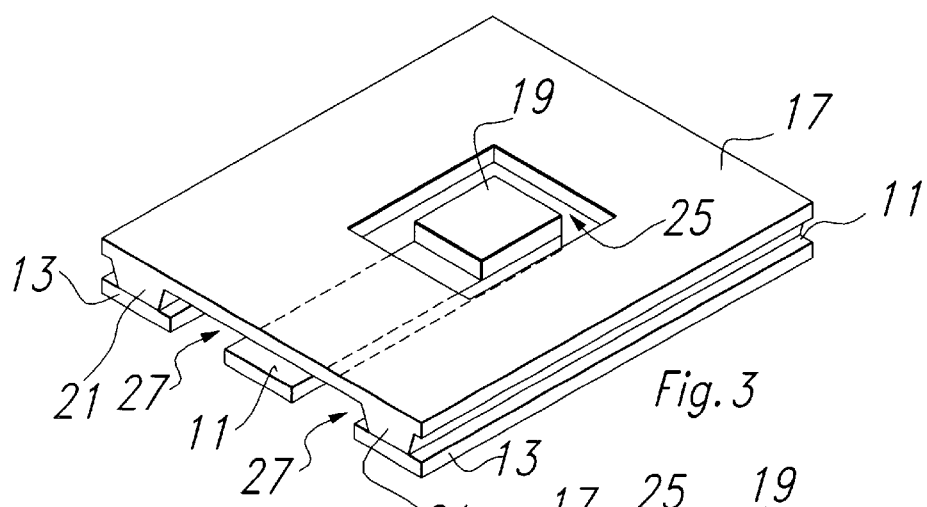
FIG. 3 is a view in elevation of a bond pad in accordance with the present invention.
Figure 4:
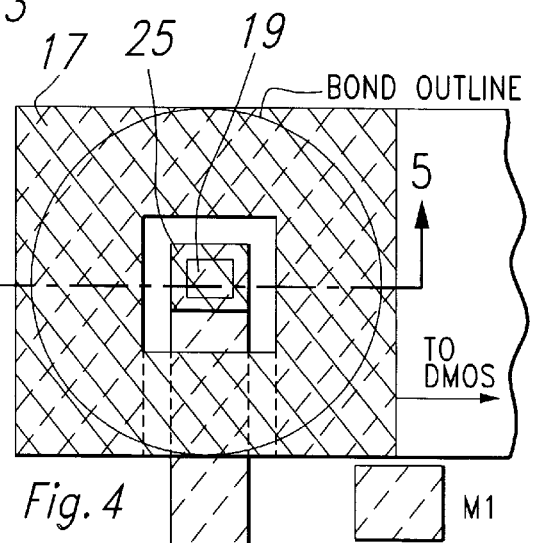
FIG. 4 is a top view of the bonding pad of FIG. 3.
Figure 5:
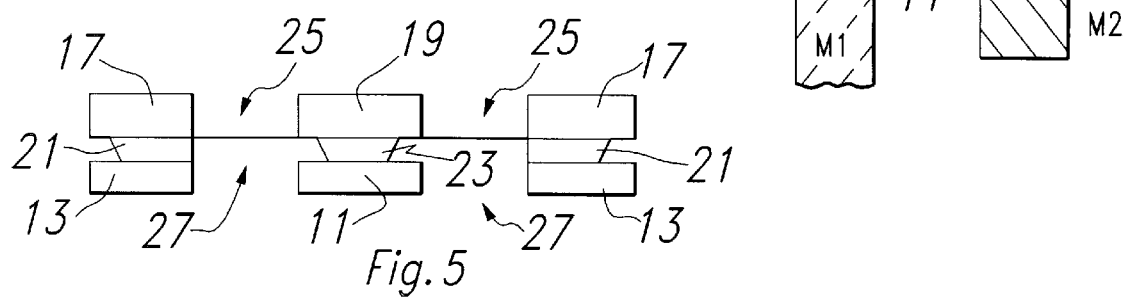
FIG. 5 is a cross sectional view taken along the line 5—5 of FIG. 4.

Referring to FIGS. 3 to 5, there is shown a bond pad in accordance with the present invention. The bond pad includes two levels of electrically conductive metal designated as M1 and M2, one atop the other. The metal level M1 is preferably a good electrical conductor compatible with the second level metal and the metal level M2 is preferably a good electrical conductor compatible with the bonding process in the assembly area. The bottom metal level M1 is spaced from the top metal level M2 by a standard electrically insulating layer 11, preferably of silicon dioxide or nitride.

The bottom level M1 includes two sections 13 and 15 which are spaced from each other by a space 27 and includes a U-shaped section 13 with a rectangular section 15 disposed within the "U" and spaced from the "U" and having a portion thereof extending outwardly beyond the "U". The top level M2 also includes two sections 17 and 19, one section 17 being a rectangular section with a hollow rectangular interior coupled to one of the bottom section 13 through a via 21 in the insulator 11 containing the metal of upper level M2 therein. The other section 19 is a second rectangular section within the hollow rectangular interior of section 17 and is spaced from the first rectangular section 17 by space 25. The section 19 is coupled to the other bottom section 15 through a via 23 in the electrical insulator 11 which contains the metal of the upper level M2 therein also. The section 19 of the upper level M2 is preferably located in the center of the bond pad area to insure that the bond 23 (shown in FIG. 4) later made is positioned in and over the space 25 between the two top level sections 17 and 19.

In operation, one of the bottom sections 15 is coupled to the zener stack and the other bottom section 13 is coupled to the power transistor. Probe testing of the transistor is accomplished by contacting the top section 17 coupled through a via 21 to the appropriate bottom section 13 with a probe in standard manner. When bonding to the bond pad later takes place, the bond 23 will enter the space 25 between the two upper level sections 17 and 19 and cover the centrally located space 25 between the two top sections. In this way, the bond area is available, the space 25 between top sections will be likely to be covered by a bond 23 during bonding due to its central location and the bond pad area is not changed to accommodate testing. Also, no contaminants can enter the bond region as in the prior art discussed above.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A bond for a semiconductor device which comprises:
   (a) a first region of electrically conductive metal disposed on a semiconductor chip, said first region having a pair of spaced apart sections;
   (b) a second region of electrically conductive metal, said second region having a pair of spaced apart sections, each of said spaced apart sections of said second region being coupled to a different one of said sections of said first region;
   (c) an electrically insulating layer disposed between said first and second regions; and
   (d) a bond completely enclosing said spaced apart sections of said first region.

2. The bond of claim 1 wherein said first region is an upper level and said second region is a lower level and said electrically insulating layer is disposed over said second region and has vias therein, each said via extending from a said region of said first section to a said region of said second section.

3. The bond of claim 2 wherein one of said spaced apart sections of said upper level is completely surrounded by the other section of said upper level.

4. The bond of claim 2 wherein one of said pair of spaced apart sections of said lower level is essentially U-shaped and the other section of said lower level is essentially rectangular shaped and extends into the open end of said "U".

5. The bond of claim 3 wherein one of said pair of spaced apart sections of said lower level is essentially U-shaped and the other section of said lower level is essentially rectangular shaped and extends into the open end of said "U".

6. The bond of claim 2 wherein one of said pair of spaced apart section of said upper level is essentially rectangular with a rectangular aperture at its central region and the other section of said upper level is essentially rectangular and disposed within said rectangular aperture.

7. The bond of claim 3 wherein one of said pair of spaced apart section of said upper level is essentially rectangular with a rectangular aperture at its central region and the other section of said upper level is essentially rectangular and disposed within said rectangular aperture.

8. The bond of claim 4 wherein one of said pair of spaced apart section of said upper level is essentially rectangular with a rectangular aperture at its central region and the other section of said upper level is essentially rectangular and disposed within said rectangular aperture.

9. The bond of claim 5 wherein one of said pair of spaced apart section of said upper level is essentially rectangular with a rectangular aperture at its central region and the other section of said upper level is essentially rectangular and disposed within said rectangular aperture.

10. A method of fabricating a bond which comprises the steps of:
    (a) providing a substrate;
    (b) providing a first region of electrically conductive metal disposed on a semiconductor chip, said first region having a pair of spaced apart sections;
    (b) providing a second region of electrically conductive metal, said second region having a pair of spaced apart sections, each of said spaced apart sections of said second region being coupled to a different one of said sections of said first region;
    (c) providing an electrically insulating layer disposed between said first and second regions; and
    (d) forming a bond completely enclosing said spaced apart sections of said first region.

11. The method of claim 10 wherein said first region is an upper level and said second region is a lower level and said electrically insulating layer is disposed over said second region and further providing vias in said electrically insulating layer, each said via extending from a said region of said first section to a said region of said second section.

12. The method of claim 11 wherein one of said spaced apart sections of said upper level is completely surrounded by the other section of said upper level.

13. The method of claim 11 wherein one of said pair of spaced apart sections of said lower level is essentially U-shaped and the other section of said lower level is essentially rectangular shaped and extends into the open end of said "U".

14. The method of claim 12 wherein one of said pair of spaced apart sections of said lower level is essentially U-shaped and the other section of said lower level is essentially rectangular shaped and extends into the open end of said "U".

15. The method of claim 11 wherein one of said pair of spaced apart section of said upper level is essentially rectangular with a rectangular aperture at its central region and the other section of said upper level is essentially rectangular and disposed within said rectangular aperture.

16. The method of claim 12 wherein one of said pair of spaced apart section of said upper level is essentially rectangular with a rectangular aperture at its central region and the other section of said upper level is essentially rectangular and disposed within said rectangular aperture.

17. The method of claim 13 wherein one of said pair of spaced apart section of said upper level is essentially rectangular with a rectangular aperture at its central region and the other section of said upper level is essentially rectangular and disposed within said rectangular aperture.

18. The bond pad of claim 14 wherein one of said pair of spaced apart section of said upper level is essentially rectangular with a rectangular aperture at its central region and the other section of said upper level is essentially rectangular and disposed within said rectangular aperture.

\* \* \* \* \*